(12) United States Patent
Sandstrom

(10) Patent No.: US 7,215,409 B2
(45) Date of Patent: May 8, 2007

(54) IMAGE FORMING METHOD AND APPARATUS

(75) Inventor: Torbjorn Sandstrom, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 137 days.

(21) Appl. No.: 10/505,564

(22) PCT Filed: Feb. 13, 2003

(86) PCT No.: PCT/SE03/00238

§ 371 (c)(1),
(2), (4) Date: Aug. 24, 2004

(87) PCT Pub. No.: WO03/071353

PCT Pub. Date: Aug. 28, 2003

(65) Prior Publication Data

US 2005/0168851 A1  Aug. 4, 2005

(30) Foreign Application Priority Data

Feb. 25, 2002  (SE) .................................. 0200547-8

(51) Int. Cl.
*G03B 27/42* (2006.01)
*G03B 27/54* (2006.01)

(52) U.S. Cl. ............................ 355/53; 355/67; 355/71; 355/77; 378/34; 378/35; 250/492.2

(58) Field of Classification Search ..................... None
See application file for complete search history.

(56) References Cited

U.S. PATENT DOCUMENTS

| 6,060,224 | A | 5/2000 | Sweatt et al. ............. 250/492.2 |
| RE37,309 | E | 8/2001 | Nakashima et al. ........... 355/53 |
| 6,285,488 | B1 | 9/2001 | Sandstrom ................... 359/290 |
| 6,312,134 | B1 | 11/2001 | Jain et al. ................... 359/855 |
| 6,597,430 | B1 | 7/2003 | Nishi et al. ................... 355/53 |
| 2004/0159636 | A1 | 8/2004 | Sandstrom et al. ...... 219/121.6 |

*Primary Examiner*—D. Rutledge
(74) *Attorney, Agent, or Firm*—Ernest J. Beffel, Jr.; Haynes Beffel & Wolfeld LLP

(57) ABSTRACT

The present invention relates to an apparatus for forming a pattern on a radiation sensitive material comprising a source to form a radiation beam, a scanning element to scan at least one beam from said radiation source over said radiation sensitive material, a modulator to modulate said at least one beam during scanning according to an input pattern data file, where said modulation of the beam creates a coherent sub-image on the workpiece and several sub-images are non-coherently superposed to create a final image. The invention also relates to a method of patterning a workpiece and a workpiece as such.

52 Claims, 8 Drawing Sheets

IMAGE FORMING METHOD AND APPARATUS

PRIORITY DATA

The present invention is the National Stage of International Application No. PCT/SE03/00238, filed Feb. 13, 2003; which application claims the benefit of Swedish Application No. 0200547-8, filed Feb. 25, 2002.

TECHNICAL FIELD

The present invention relates in general to techniques for optical lithography, and in particular to a method for patterning a workpiece using an SLM, it also relates to a workpiece and to an apparatus for patterning a workpiece.

DESCRIPTION OF THE BACKGROUND ART

The lithographic production of integrated circuits, masks, reticles, flat panel displays, micro mechanical or micro optical devices and packaging devices, e.g. lead frames and MCM's may involve an optical system to image a master pattern contained on a SLM onto a wafer comprising a layer sensitive to electromagnetic radiation using for example visible or non-visible light.

Said SLM may for instance be a Spatial Light Modulator (SLM) comprising a one or two dimensional array or matrix of reflective movable micro mirrors, a one or two dimensional array or matrix of transmissive LCD crystals or other similar programmable one or two dimensional arrays based on gratings effects, interference effects or mechanical elements, e.g. shutters.

Pattern generators using spatial light modulators generally use a pulsed electromagnetic radiation source in order to project the pattern of the SLM onto the workpiece. The pulse length is typically in the range of nanoseconds and the repetition rate is typically in the range of kHz.

A problem with said pulsed electromagnetic radiation sources is that they may have a pulse to pulse energy variation or a variation in time between adjacent pulses, a so-called jitter, which may affect the critical dimension of the written pattern.

SUMMARY OF THE INVENTION

In view of the foregoing background, the pulse to pulse energy variations is critical for accomplishing line width in the range of sub micrometers and line width tolerances of the order of 5 nm.

Accordingly, it is an object of the present invention to provide a method for patterning a workpiece with high resolution which overcomes or at least reduces the above mentioned problem.

In a first embodiment, the invention provides an apparatus for patterning a workpiece arranged at an image plane and covered at least partly with a layer sensitive to electromagnetic radiation. Said apparatus comprising a source emitting electromagnetic radiation onto an object plane, an SLM comprising a plurality of on-off object pixels, adapted to receive and modulating said electromagnetic radiation at said object plane in accordance to an input pattern description and to relay said electromagnetic radiation toward said workpiece, a synchronizer to synchronize the motion of the workpiece relative to a relayed pattern description from said SLM onto said workpiece, and an image-deflecting element arranged between said SLM and said workpiece adapted to deflect said relayed pattern description.

In another embodiment said SLM comprises transmissive pixels.

In yet another embodiment said SLM comprises reflective pixels.

In still another embodiment said reflective pixels are micromirrors.

In still another embodiment said synchronization is performed to cause said relayed pattern description to impinge on a fixed area of said workpiece for an extended period of time.

In still another embodiment the radiation from said electromagnetic radiation source is prevented from impinging onto said workpiece while reloading said SLM with a new pattern description.

In still another embodiment said radiation is deflected in order to be prevented from impinging onto said workpiece.

In still another embodiment said radiation is blocked in order to be prevented from impinging onto said workpiece.

In still another embodiment said radiation source is switched off in order to prevent said radiation from impinging onto said workpiece.

In still another embodiment successive pattern descriptions on said SLM are imaged onto said workpiece adjacent to each other.

In still another embodiment successive pattern descriptions on said SLM are at least partly overlapping on said workpiece.

In still another embodiment successive pattern descriptions on said SLM are non-overlapping on said workpiece.

In still another embodiment successive pattern descriptions on said SLM are imaged onto said workpiece non-adjacent to each other.

In still another embodiment said image deflecting element is a rotating prism.

In still another embodiment said image deflecting element is a rotating reflective polygon.

In still another embodiment said rotating reflective polygon comprises at least three reflecting surfaces.

In still another embodiment said pattern description on said SLM is changed while deflecting said relayed pattern description onto the workpiece.

The invention relates also to a method for patterning a workpiece arranged at an image plane and covered at least partly with a layer sensitive to electromagnetic radiation. Electromagnetic radiation is emitted onto an object plane, said electromagnetic radiation is received and modulated at said object plane in accordance to an input pattern description by an SLM comprising a plurality of on-off object pixels, said electromagnetic radiation is relayed toward said workpiece, a relayed pattern description is deflected from said SLM onto said workpiece, the motion of the workpiece is synchronized relative to said relayed pattern description from said SLM onto said workpiece In another embodiment said SLM comprises transmissive pixels.

In still another embodiment said SLM comprises reflective pixels.

In yet another embodiment said reflective pixels are micromirrors.

In still another embodiment synchronizing is performed to cause said relayed pattern description from said SLM to impinge on a fixed area of said workpiece for an extended period of time.

In still another embodiment of the present invention said radiation is preventing from said electromagnetic radiation source from impinging onto said workpiece while reloading said SLM with a new pattern description.

In still another embodiment said radiation is deflected in order to be prevented from impinging onto said workpiece.

In still another embodiment said radiation is blocked in order to be prevented from impinging onto said workpiece.

In still another embodiment said radiation source is switched off in order to prevent said radiation from impinging onto said workpiece.

In still another embodiment successive pattern descriptions are imaged onto said workpiece adjacent to each other.

In still another embodiment successive pattern descriptions are at least partly overlapping on said workpiece.

In still another embodiment successive pattern descriptions are non-overlapping on said workpiece.

In still another embodiment successive pattern descriptions are imaged onto said workpiece non-adjacent to each other.

In still another embodiment said image deflecting element is a rotating prism.

In still another embodiment said image deflecting element is a rotating reflective polygon.

In still another embodiment said rotating reflective polygon comprises at least three reflecting surfaces.

In still another embodiment greyscale printing is performed by time multiplexing the object pixels.

In still another embodiment synchronization is performed to write stamps onto said workpiece corresponding to pattern descriptions on said SLM, where said stamps defining sub-images together form a complete pattern.

In still another embodiment said pattern description is changed on said SLM while deflecting said relayed pattern description onto the workpiece.

The invention also relates to a workpiece arranged at an image plane and covered with a layer sensitive to electromagnetic radiation, wherein said layer is illuminated by electromagnetic radiation relayed from an SLM, arranged at an object plane and comprising a plurality of on-off object pixels, adapted to receive and modulating said electromagnetic radiation at said object plane in accordance to an input pattern description, a motion of said workpiece is synchronized with said relayed pattern description from said computer-controlled reticle onto said workpiece, where said relayed pattern description is deflected by an image deflecting element arranged between said SLM and said workpiece.

In another embodiment said workpiece is a reticle or a mask.

In another embodiment said workpiece is a semiconducting wafer.

The invention also relates to a method to form an image. A laser source is provided. At least one beam from said laser source is scanned over a workpiece. Said at least one beam during scanning is modulating according to an input pattern data file, where modulation of the beam creates a coherent sub-image on the workpiece and several sub-images are non-coherently superposed to create a final image.

In another embodiment of the present invention interference between individual beams is destroyed before impinging onto the SLM.

In another embodiment of the present invention said interference between individual beams are destroyed by means of adding or subtracting a shift in frequency.

In another embodiment of the present invention said interference between individual beams are destroyed by means of adding or subtracting a portion of path length.

In another embodiment of the present invention said at least one beam is modulated by means of an acousto-optic cell comprising an array of transducers.

In another embodiment of the present invention said transducers are driven by a RF wave multiplied by an analogue signal.

In another embodiment of the present said at least one beam is modulated by means of an SLM comprising a plurality of on-off pixels.

The invention also relates to a method for forming an image onto a workpiece. An electromagnetic radiation source is provided. At least one beam from said source is scanned over at least a portion of a spatial light modulator. Said at least one beam is modulated according to an input pattern data file, where said modulation of the at least one beam creates a coherent sub-image on the workpiece and several sub-images are non-coherently superposed to create a final image.

In another embodiment according to the present invention a new pattern description is reloaded on at least one portion of said modulator while scanning a different portion of said modulator by said at least one beam.

In still another embodiment of the present invention said SLM comprising a plurality of on-off pixels.

The invention also relates to an apparatus for forming a pattern on a radiation sensitive material comprising a source to form a radiation beam, a scanning element to scan at least one beam from said radiation source over said radiation sensitive material, a modulator to modulate said at least one beam during scanning according to an input pattern data file, where said modulation of the beam creates a coherent sub-image on the workpiece and several sub-images are non-coherently superposed to create a final image.

In another embodiment of the invention said apparatus also comprises an element to destroy the interference between individual beams before impinging onto the SLM.

In yet another embodiment of the invention the interference is destroyed by an element, which adds or subtracts a shift in frequency unequal for interferable beams.

In still another embodiment of the invention the interference is destroyed by an element, which adds or subtracts an unequal portion of optical path-length for interferable beams.

In still another embodiment of the invention said modulator is an acousto-optic cell comprising an array of transducers.

In still another embodiment of the invention said transducers are driven by a RF wave multiplied by an analogue signal.

The invention also relates to an apparatus for forming a pattern on a radiation sensitive material comprising a source to form a radiation beam, a scanning element to scan at least one beam from said radiation source over a spatial light modulator, a modulator to modulate said at least one beam according to an input pattern data file, where said modulation of the beam creates a coherent sub-image on the workpiece and several sub-images are non-coherently superposed to create a final image.

In anther embodiment of the invention a new pattern description is reloaded on at least one portion of said modulator while scanning a different portion of said modulator by said at least one beam.

The invention also relates to an apparatus for patterning a workpiece arranged at an image plane and covered at least partly with a layer sensitive to electromagnetic radiation, comprising a source emitting electromagnetic radiation onto an object plane, a modulator comprising a plurality of modulating elements, adapted to receive and modulating said electromagnetic radiation at said object plane in accordance to an input pattern description and to relay said electromagnetic radiation toward said workpiece, a synchronizer to synchronize the motion of the workpiece relative to a relayed pattern description from said SLM onto said workpiece and a loading of said input pattern description, and an image-deflecting element adapted to deflect said relayed pattern description on the workpiece.

The invention also relates to a method for patterning a workpiece arranged at an image plane and covered at least partly with a layer sensitive to electromagnetic radiation. Electromagnetic radiation is emitted onto an object plane. Said electromagnetic radiation is received and modulated at said object plane in accordance to an input pattern description by a modulator comprising a plurality of modulating elements. Said electromagnetic radiation is relayed toward said workpiece. A relayed pattern description is deflected from said modulator onto said workpiece. The motion of the workpiece is synchronized relative to a relayed pattern description from said modulator onto said workpiece and a loading of said input pattern description.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION OF THE PREFFERED EMBODIMENTS

Figure 1:
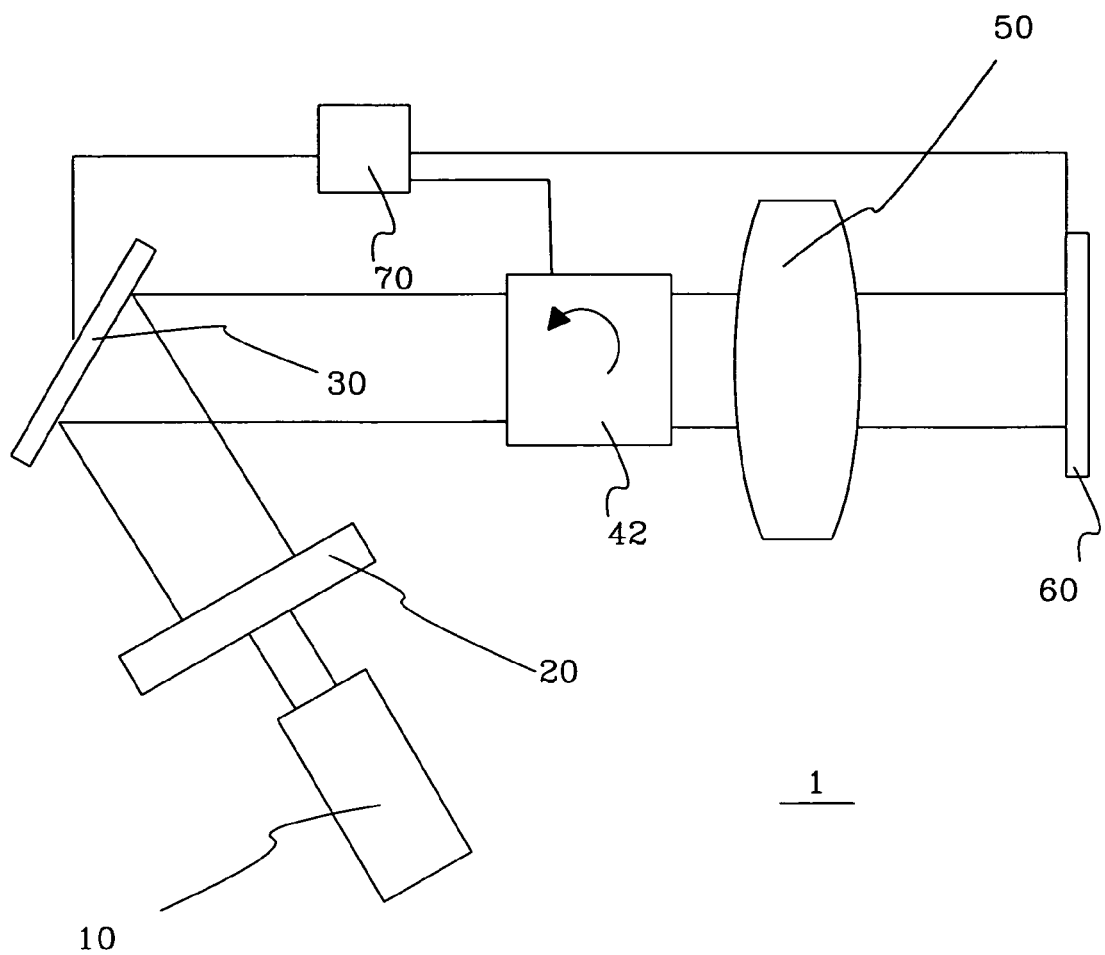
FIG. 1 illustrates a top view of an embodiment of a pattern generator according to the invention.

FIG. 1 illustrates an embodiment of an apparatus 1 for patterning a workpiece 60 according to the invention. Said apparatus 1 comprising a source 10 for emitting electromagnetic radiation, an SLM 30, a beam conditioner arrangement 20, a workpiece 60, a lens arrangement 50, a synchronizer 70 and an image-deflecting element 42.

The source 10 may emit radiation in the range of wavelength from infrared (IR), which is defined as 780 nm up to about 20 nm, to extreme ultraviolet (EUV), which in this application is defined as the range from 100 nm and down as far as the radiation is possible to be treated as electromagnetic radiation, i.e. reflected and focused by optical components. The source 10 emits radiation continuously or having extended pulse lengths such as in the range of milliseconds to microseconds. The source for emitting electromagnetic radiation may be a doubled ion laser or quadrupled Nd-YAG laser or similar devices.

Between the radiation source 10 and the SLM 30, said beam conditioner unit is arranged, which unit 20 expand and shapes the beam to illuminate the surface of the SLM in a uniform manner. The beam conditioner unit may be a simple lens or an assembly of lenses or other optical components. The beam conditioner unit 20 distributes the radiation emitted from the radiation source 10 uniformly over at least a part of the surface of the SLM 30.

In a preferred embodiment the beam shape is rectangular. The beam divergence may be different in x-direction and Y-direction and the radiation intensity is often non-uniform over the beam cross-section. The beam may have the shape and size of the SLM 30 and homogenized so that the rather unpredictable beam profile is converted to a flat illumination with a uniformity of, for example, 1–2%. This may be done in steps: a first beam shaping step, a homogenizing step and a second beam-shaping step. The beam is also angularly filtered and shaped so that the radiation impinging on each point on the SLM has a controlled angular sub tense.

The optics of the invention is similar to that of a wafer stepper. In steppers the beam is homogenized in a light pipe, a rectangular or prism-shaped rod with reflecting internal walls where many mirror images of the light source are formed, so that the illumination is the superposition of many independent sources. Splitting and recombining the beam by refractive, reflective or diffractive optical components may also perform homogenisation.

The SLM 30 may be a spatial light modulator, comprising a one or 2 dimensional array of individually addressable pixel elements. Said pixel elements may be transmissive or reflective. The pixel elements operate digitally, i.e., in an on or off fashion. Pixel elements in an on state reflect or transmit an impinging electromagnetic radiation onto the workpiece depending on if the element is reflective or transmissive respectively. Pixel elements in an off state deflect or block the impinging electromagnetic radiation, i.e., this part of the electromagnetic radiation will not end up onto the workpiece. Grayscaling of the imaged pattern onto the workpiece is performed by flipping individual pixel elements between said on and off state by a predetermined frequency.

The image-deflecting element 42 is in this embodiment a prism. Said prism is made rotatable along for example its central axis. The rotation of the prism is synchronized with the movement of the workpiece 60 by means of a synchronizer 70. Said synchronizer measures the angle of rotation of said prism and compare said measured angle of rotation with the position of the workpiece. There is a given relationship between the speed of rotation of said prism and the speed of movement of said workpiece. The synchronizer adjust the speed of movement of the workpiece or the speed of rotation of said prism, or an adjustment of both of them simultaneously, in order to image a given pattern from said SLM onto a specific area of the workpiece for an extended period of time. Typically, different areas of the workpiece are imaged for time periods in the range of microseconds to milliseconds.

Said electromagnetic source is switched off or the beam is directed out of the SLM area or the workpiece area while loading the SLM with a new pattern. Loading the SLM with a new pattern may last in the range of microseconds. Alternatively said radiation from said electromagnetic source is temporarily blocked while loading the SLM with a new pattern description. Having loaded the SLM with a new pattern said source of electromagnetic radiation 10 is started to continuously radiate electromagnetic radiation onto said SLM until a new pattern is to be loaded. The relayed SLM pattern is creating a stamp on said workpiece. Different stamps are stitched together to create a full image on the workpiece.

In FIG. 1, said prism comprises four different surfaces. The prism may be rotated at a constant speed. A first pattern may be transmitted through said prism during a first time interval while a first surface is facing towards the SLM 30. No electromagnetic radiation is impinged on said workpiece while reloading it with a new pattern. Said prism 42 is rotated and a second surface is facing toward said SLM. Said electromagnetic radiation is reflected by said SLM and transmitted through said prism during a second time interval while said second surface of said prism is facing said SLM. This procedure is continued for different patterns of the SLM and different surfaces of said prism.

A strip comprises a number of stamps stitched together on the workpiece. Said stamps may be made to be overlapping or non-overlapping. When a strip is finished a new strip is imaged onto the workpiece. Said strip may be made to overlap the previous imaged strip on said workpiece. Alternatively the strips may be imaged in an order where two strips imaged onto the workpiece after each other may or may not be imaged adjacent to each other. There is also a possibility to image the different strips in a meandering fashion, i.e., the stamps in a first strip is imaged from a bottom of a workpiece to a top of a workpiece and the stamps in the second strip is imaged from the top of the workpiece to the bottom of the workpiece. Said first and second strips may or may not be imaged adjacent to each other. The stamps are preferably imaged consecutively after each other, however there is of course possible to blank out one stamp by not switching on the laser or direct the electromagnetic radiation so as to not impinging said workpiece. A shutter may also be used for the purpose of blanking out SLM patterns on the workpiece. Said shutter may be arranged anywhere in the electromagnetic path between said electromagnetic radiation source and said workpiece.

Lens arrangement 50, illustrated in FIG. 1 with a single lens, may be used to demagnify the image relayed from the SLM. This lens arrangement may comprise a plurality of lenses, which may correct for different optical phenomena.

Mirror SLM pixels are typically operated electrostatically, but other ways of operating micro mirrors are possible, for example by a piezoelectric crystal. Transmissive pixels may be of the type of liquid crystals.

A specific area in the pattern on the workpiece may be written with one or a plurality of writing passes. If one writing pass is used to create the pattern a dose of electromagnetic radiation higher than the exposure threshold must be used in order to expose a photosensitive layer (resist layer) on the workpiece. If N writing passes are used said exposure threshold can be divided N times, i.e. one writing pass is only using a part of the dose required to expose the photosensitive layer. Every single writing pass may use the same dose of electromagnetic radiation but said dose may also be divided unequal between the different writing passes.

In a multipass writing strategy the image from the SLM onto the SLM may be displaced N pixel lengths along a row of pixels, along a column of pixels or along both a row and a column of pixels between at least two of said writing passes. Between one or a plurality of said writing passes the image from the SLM onto the workpiece may be displaced only a fraction of a pixel length in a direction parallel to a row of pixels, in a direction parallel to a column of pixels or along both a row and a column of pixels.

Figure 2:
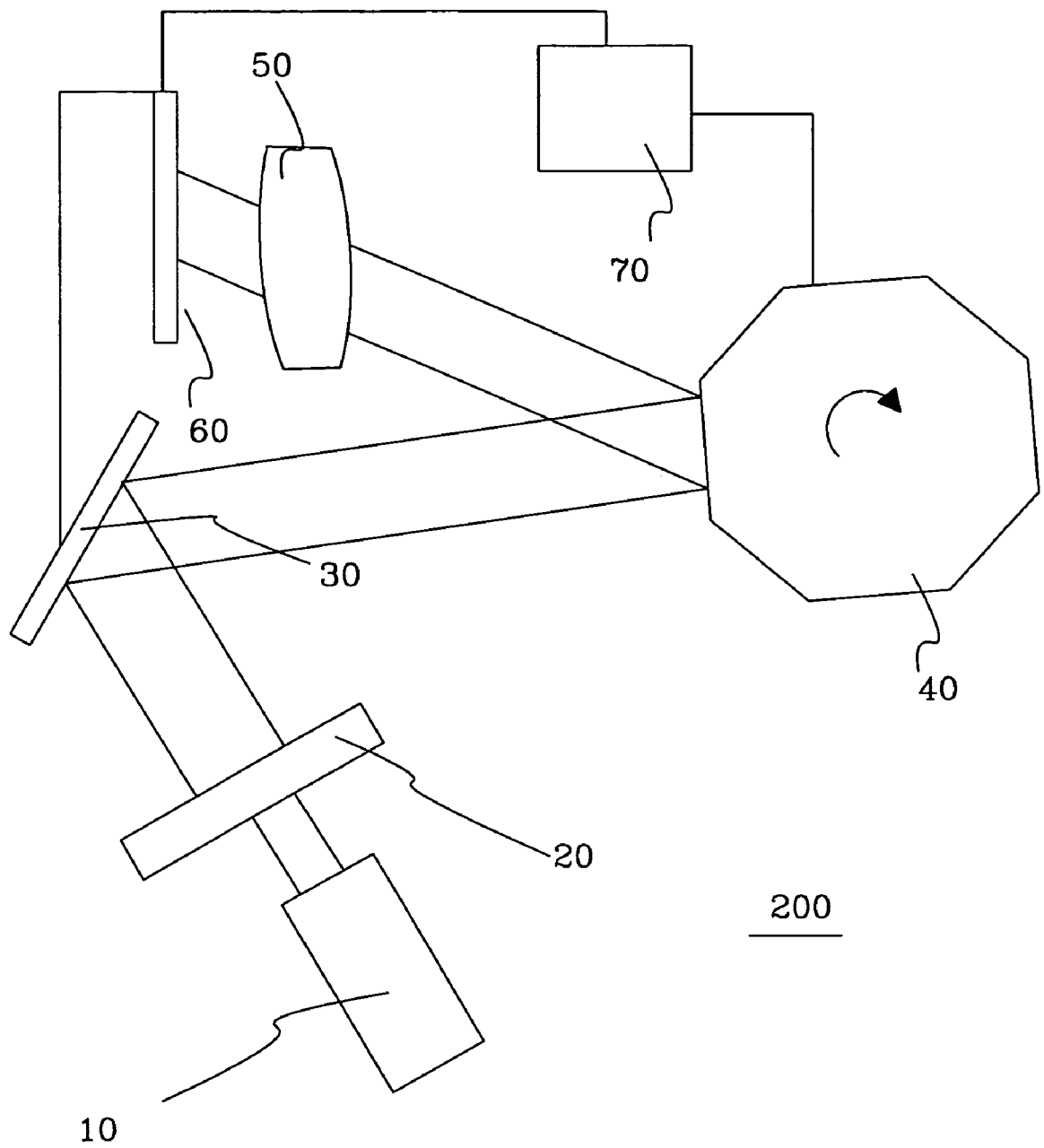
FIG. 2 illustrates a top view of another embodiment of a pattern generator according to the invention.

FIG. 2 illustrates another embodiment of a pattern generator according to the invention. This embodiment of the pattern generator 200 only differs from the embodiment illustrated in FIG. 1 by having a rotating polygon 40 instead of a rotating prism 42. In the prism the image from the SLM was transmitted from one side to another. The polygon instead reflects the image from the SLM onto the workpiece 60. This embodiment works essentially in the same way as the one described in connection with FIG. 1 A synchronizer synchronizes the speed of rotation of the polygon and the speed of movement of the workpiece in order to image a specific pattern on the SLM onto a specific area of the workpiece. A source of electromagnetic radiation radiates continuously onto the SLM while the polygon deflects the image of said SLM onto said workpiece. The electromagnetic radiation is not impinging onto said workpiece while a new pattern is loaded onto the SLM. Also synchronized with the movement of the workpiece and the image deflecting element is the delivery of new pattern description to the modulator.

The rotating polygon may comprise any number of surfaces, in FIG. 2, said polygon is illustrate to have eight surfaces.

Figure 3:
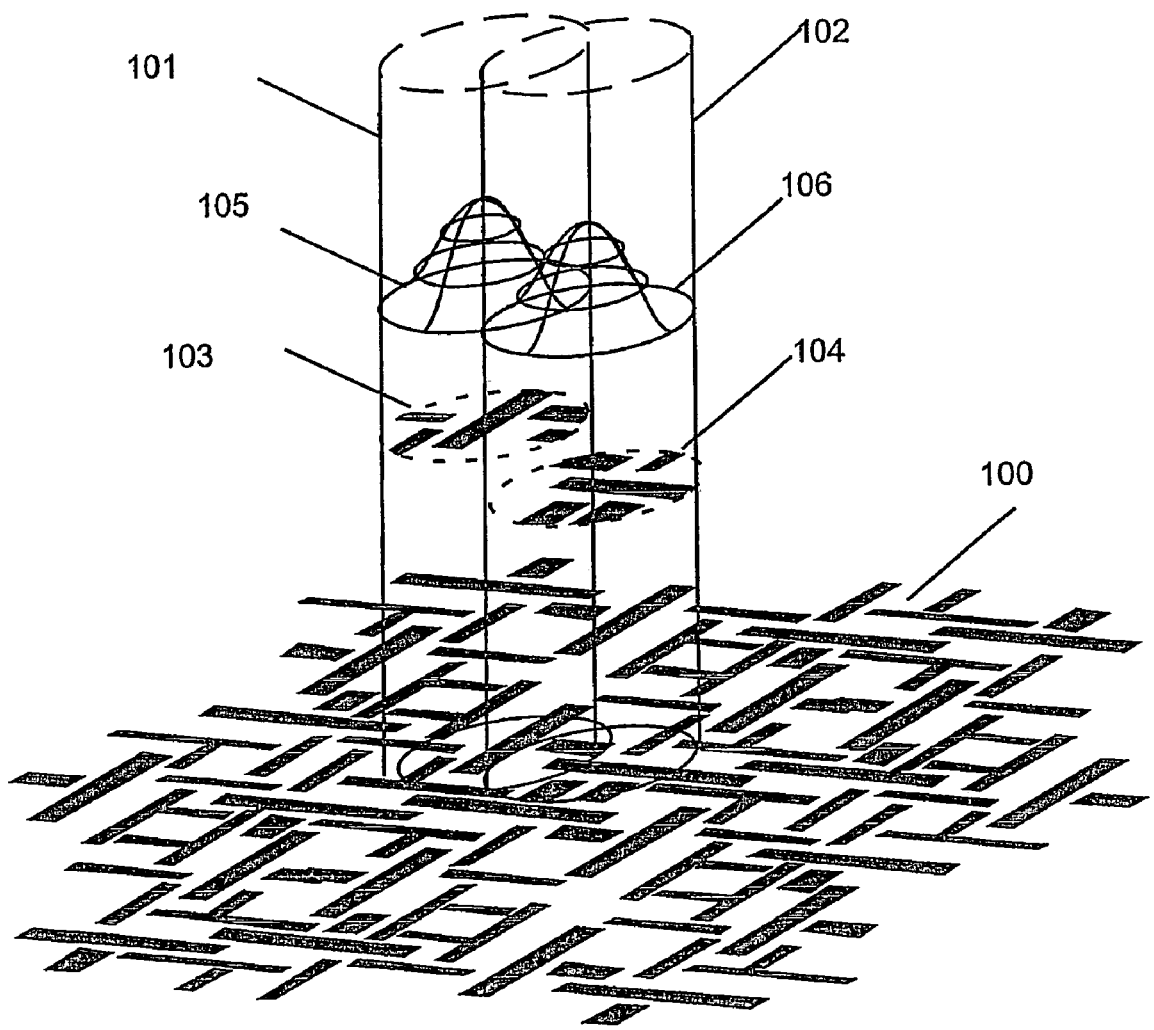
FIG. 3 illustrates a superposition of coherent sub-images.

FIG. 3 illustrates the principle where an image 100 is formed by superposition of coherent sub-images 103 and 104 printed by the mutually non-coherent laser beams 101 and 102 respectively. Illustrated in FIG. 3 are the intensity profiles 105 and 106 that create a smooth image without stitching boundaries between sub-images 103 and 104.

Figure 4:
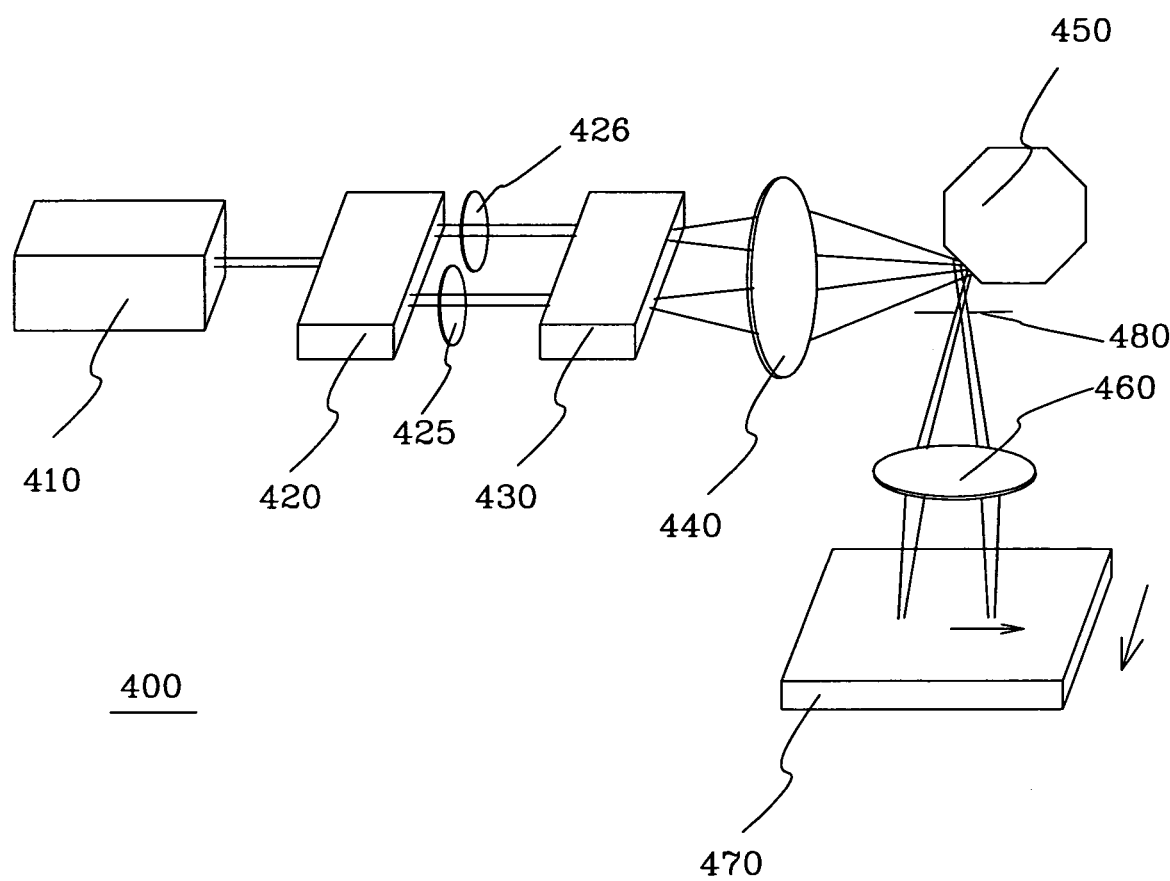
FIG. 4 illustrates a perspective view of yet another embodiment of a pattern generator according to the invention.

FIG. 4 illustrates yet another embodiment of a pattern generator 400 according to the invention. Said pattern generator 400 comprises an electromagnetic radiation source, a beam splitter 420, filters 425, 426, a modulator 430, a first lens arrangement 440, an image-deflecting element 450, a second lens arrangement 460, a workpiece 470 and a stop 480.

The electromagnetic radiation source 410 may be a doubled gas laser or a quadrupled YAG-Nd laser with an output beam at a wavelength of for example 266 nm. The beam splitter 420 comprises for example a plurality of acousto-optic Bragg cells. The filters 425 and 426 may be simple apertures. The modulator 430 may be an acousto-optic cell with multiple transducers along an axis essentially perpendicular to an optical axis in a system where it is provided. The first and second lens arrangements, 440 and 460 respectively, may comprise one or a plurality of lenses, which take care of magnification and appropriate optical corrections. The image deflecting element 450 may be a rotating mirror having a plurality of facets for causing said beam or beams from the electromagnetic radiation source to scan the workpiece. The workpiece 470 may be a transparent substrate coated with a thin layer of opaque material on top of which a layer of material sensitive to electromagnetic radiation is provided for forming a mask or a reticle. The workpiece may also be a semiconducting substrate coated with a material sensitive to electromagnetic radiation for forming an integrated circuit.

The size of the stop 480 may affect the size of the beam on the workpiece.

Figure 5:
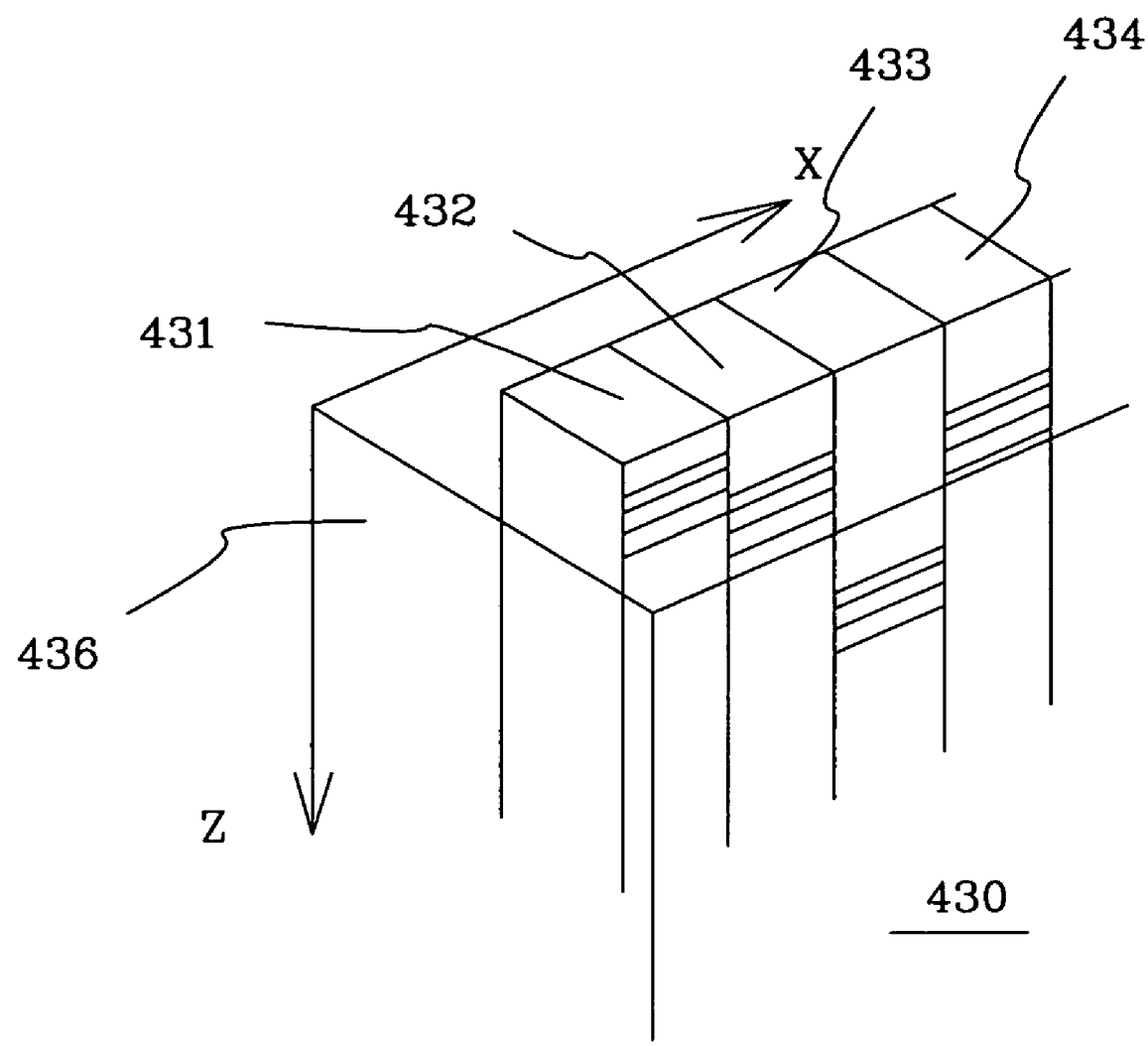
FIG. 5 illustrates a perspective view of an acousto-optical modulator array.

The beams are scanned and an acousto-optic modulator in the embodiment as illustrated in FIG. 4 modulates each beam. The beam is relatively large when entering the modulator, so that different areas of the modulator are resolved in the projected image. The different areas are independently modulated with intensity and/or phase. In the normal use of an acousto-optic modulator the modulated beam is the first diffracted order and the phase and amplitude (i.e. complex amplitude) of the modulated beam is the complex amplitude of the laser beam multiplied by the complex amplitude of the acoustic wave. The latter can be controlled, thereby forming a complex RF modulator (e.g. a balanced mixer). Therefore the different resolved areas of the modulator can be given any wanted complex amplitude. The modulator may have several closely spaced acoustic transducers as illustrated in FIG. 5, providing a lateral spatial resolution and a longitudinal (along the sound wave) resolution into different areas is created by the time sequence of each RF signal.

The plurality of acoustic channels are provided in one direction and a wave with appropriate frequency is applied in an essentially perpendicular direction to both said acoustic channels and said optical axis of the system, thereby creating a 2-dim complex modulating pattern.

Figure 6:
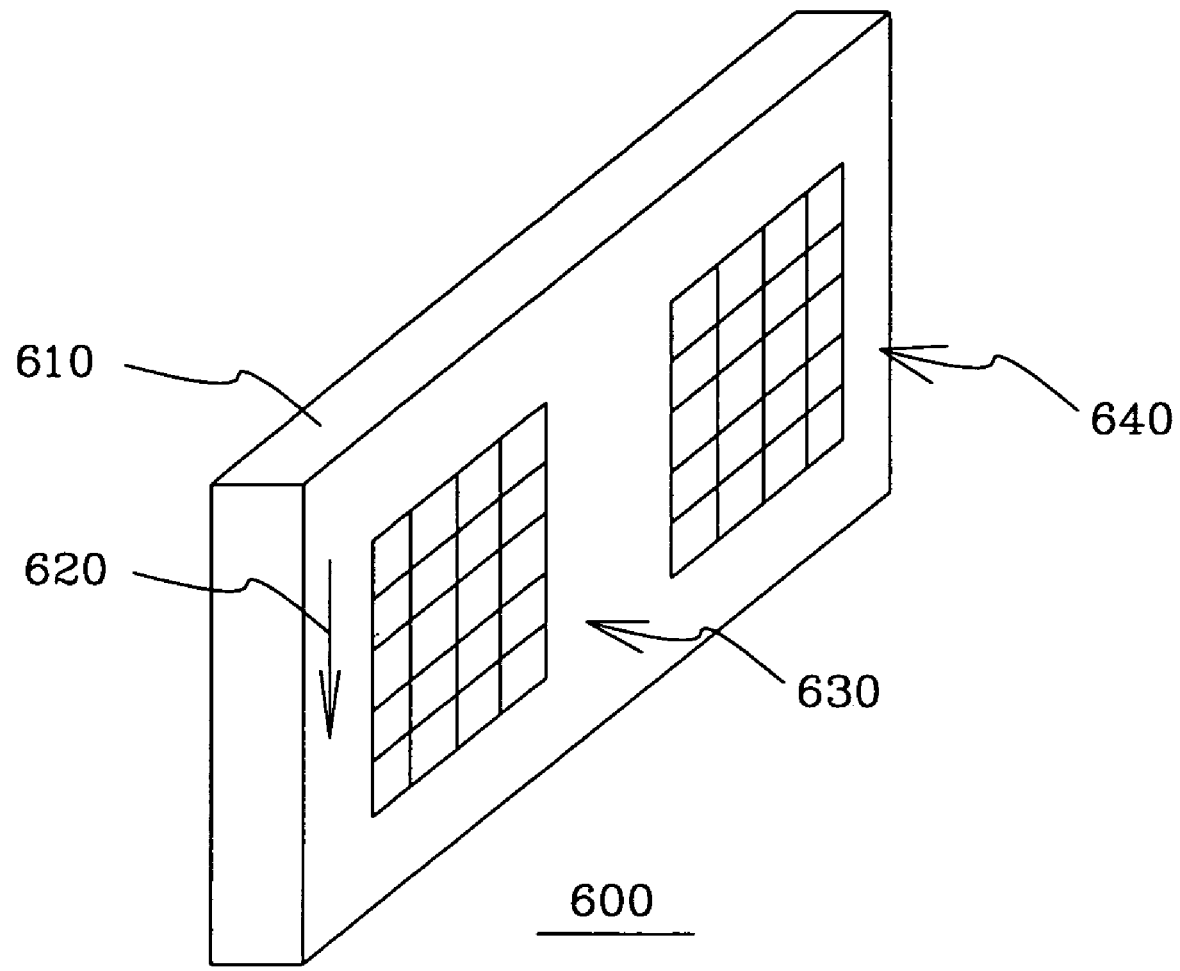
FIG. 6 illustrates a perspective view of a dual SLM chip.

FIG. 6 illustrates a substrate 610 comprising two SLM structures 630, 640. In an alternative embodiment to the one described in connection with FIGS. 4 and 5 a micromechanical phase-shifting reflecting 256×256 array may be used as a modulator. The elements may be similar to the gratings used by Silicon Light Machines but with two interleaved gratings with individually controlled phase. By driving to all combinations of phase al complex amplitudes can be achieved. The switching time is of the order of 25 ns and the "dot clock" is 10 MHz assuring that the modulator has enough time to establish a complex value during one electronic clock cycle. Alternatively an SLM comprising a plurality of on-off pixels may be used in the embodiment illustrated in FIG. 6, where said pixels may be reflective or transmissive.

The elements are driven by a chip, which shifts contents of cells along, in a similar way as the acousto-optic cell transports data. The same type of essentially coherent laser source is used as in FIG. 4. However, the modulation is not by noise but by a sine wave with frequency being a multiple of the equivalent "dot clock" in the scanning direction. In this way the frequency shifted beamlets interfere with an integer number of periods over one period, leading to an efficient suppression of interference.

An alternative SLM structure comprises pixels being pistons, tilting reflective plates or transmissive liquid crystals or any other type. To be combined with a scanning system using continuous laser beams it is advantageous to have the data scrolling over the modulator surface, so that a particular image element remains essentially stationary in the projected image, taken the scanning movement of the laser beams into account.

In FIG. 5 there is illustrated an embodiment of the acousto-optic modulator 430. Said modulator is illustrated to have five transducers 431, 432, 433, 434, 435 arranged along a line. Said modulator may comprise any number of transducers but for reason of clarity there is only illustrated 5 of them. The transducers may be made of lithium niobate and they are embedded in a material 436, which material may be crystalline quartz. The transducers are spaced closely enough to make the images from them partially overlap and interfere on the workpiece. This condition is determined by the design and resolution of the projection optics comprising said first and second lens arrangements 440 and 460 respectively.

Each transducer may be driven by a crystal stabilised RF wave multiplied by an analogue signal. The analogue signal may be amplitude and/or phase modulated allowing data delivery electronics to change both power and phase of the ultrasound wave. A calibration procedure is used to synchronize the phase of all channels so that phase zero in each channel means that all optical beams through the modulator are in phase.

The laser beam is sent through said acousto-optic Bragg cells, which split the beam into an array of light beamlets with frequency shift from the driving RF. The driving RF is for example 500 MHz phase modulated with for example 160 MHz bandwidth noise. The result is a two-dimensional diffraction pattern with random momentary speckle pattern, but over the time it takes for the scanned image to move one resolution spot on the workpiece the speckle is averaged out. The beams can therefore be considered to be non-interfering. All the beamlets from the beam splitter 420 are focussed onto the same area of the modulator 430.

Multiple acoustic channels in one direction, i.e., the transducers 431, 432, 433, 434, 435, and the transported sound pattern in the perpendicular direction create a two-dimensional complex modulation pattern. With a proper spot size, scanning speed and final optics this will create a partially coherent image of the complex pattern on the modulator.

A data delivery system is used to convert the input pattern description to a complex phase and intensity pattern on the modulator, synchronized with the movement of the scanner and/or the scanner to build a contiguous pattern.

Inserting pupil filters and/or modifications to the illumination of the modulator(s) may perform resolution improvements of the pattern generator. Most efficient may be a combination of both and a decomposition of the pattern, so that features of different types are exposed at a separate exposure with appropriately chosen filter functions for pupil and illuminator. Preferably the pupil filter used according to this invention has a dogbane shape for writing of patterns with narrow parallel lines. Further, the pupil filter could have an area for attenuating the spatial component of light corresponding to large features in a pattern. The pupil filter could also be one or a plurality of SLM's. Said SLM could be used to control angular distribution of the illumination at the modulator creating the pattern which is to be imaged onto the workpiece.

In general, steppers illuminated by a discharge or incandescent lamp create an image, where two points close together in the image plane are coherent with each other, while two points separated by a longer distance are incoherent. The complete image is formed instantaneously through the coherent addition of adjacent image elements and the incoherent superposition of other image elements spaced apart by a distance that is determined by the illumination system.

Figure 7:
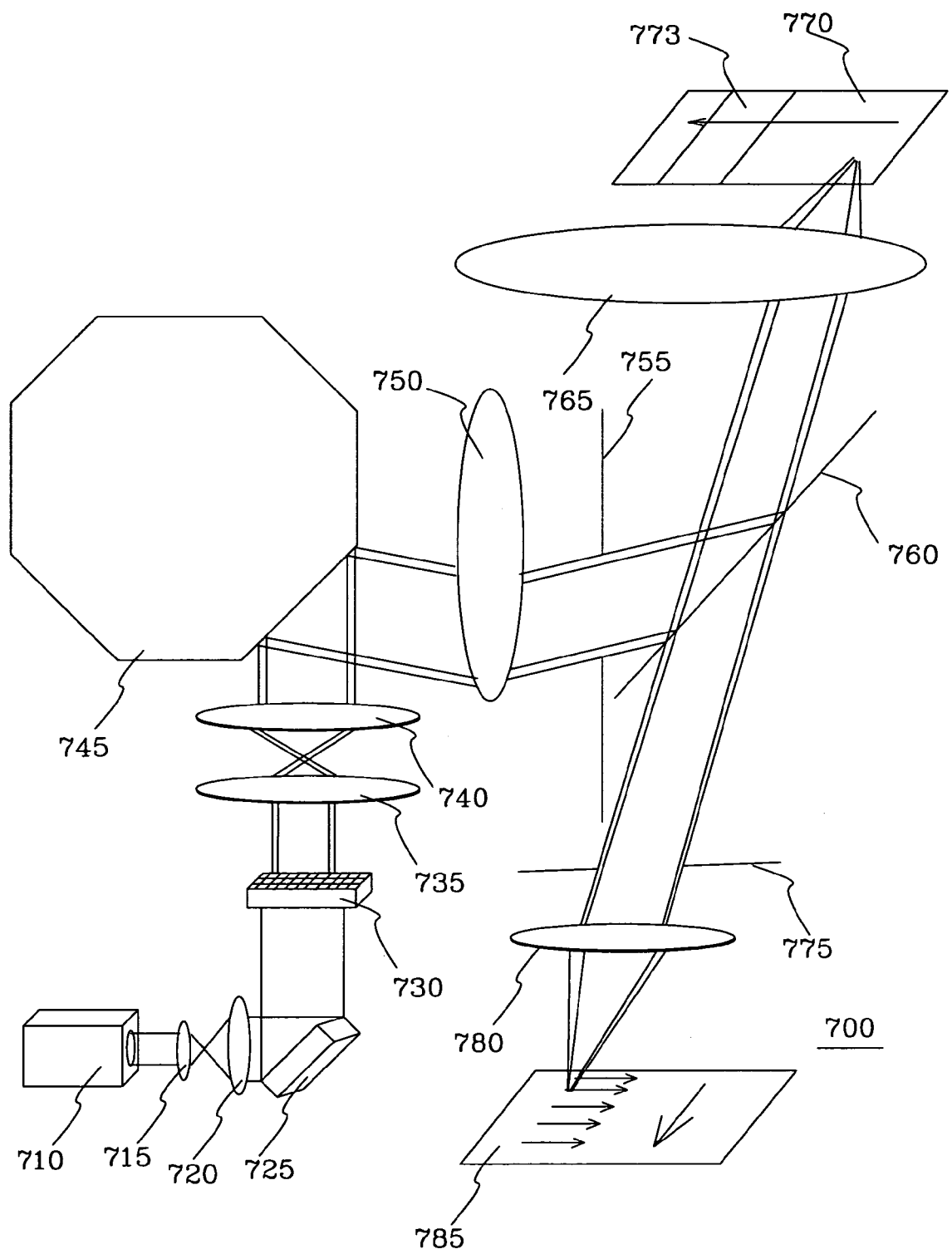
FIG. 7 illustrates a perspective view of still another embodiment of a pattern generator according to the invention.

FIG. 7 illustrates yet another embodiment of a pattern generator according to the present invention. Said pattern generator comprises a radiation source 710, a first and second lens arrangements 715, 720 respectively, a mirror 725, a first beam splitter 730, a third and fourth lens arrangements 735, 740 respectively, an image deflecting element 745, a fifth lens arrangement 750, a first aperture 755, a second beam splitter 760, a sixth lens arrangement 765, a spatial light modulator 770, a second aperture 775, a seventh lens arrangement 780 and a workpiece 785.

The lenses 715, 720, 735, 740, 750, 765, 780 belong to the projection optics to form the beam and correct for possible optical phenomena not desired to be imaged onto the workpiece 785. The beam splitter 730 creates a brush of beams. Said beams are scanned over the surface of the SLM 770. The SLM is reloaded with new pattern where it is not scanned by the laser beams, illustrated in FIG. 7 by portion 773. In this way the SLM can be continuously rewritten although it is illuminated by a continuous radiation source 710. The beam is split into an array of beamlets by the first beam splitter 730 that illuminate the modulator area simultaneously, but where interference between the beams is destroyed by a shift infrequency or a continuous change in path length during scanning, so that any interference pattern are averaged over all phase angles for any point on the workpiece.

The image-deflecting element 745 may be a rotating mirror having a plurality of facets, a galvanometer, an acousto-optical deflector or a holographic scanner. The apertures 755, 775 respectively determine the imaging properties. Lenses in FIG. 7 may very well be all reflective. The number of beams can be very large coming out of the beam splitter 730, e.g., 1000 beams or more. A data rate for the pattern generator illustrated in FIG. 7 may be as large as 100 Gpixels/s.

Figure 8:
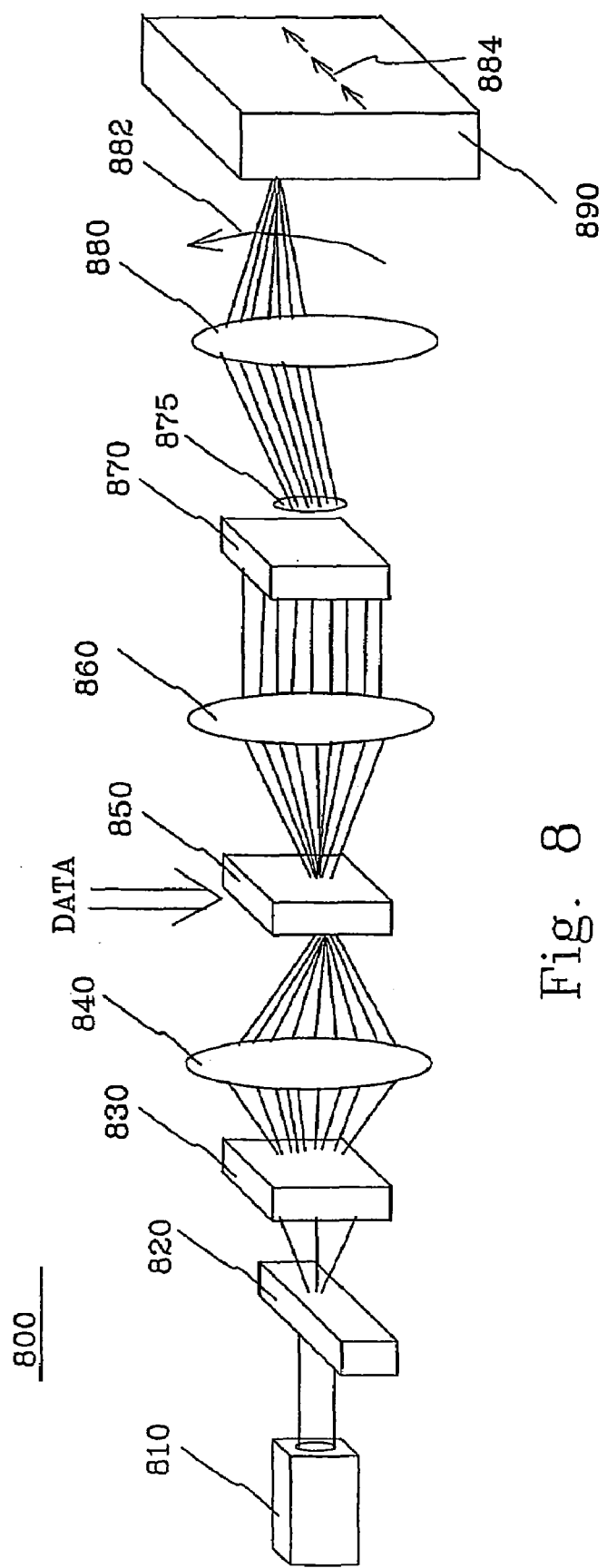
FIG. 8 illustrates a perspective view of still another embodiment of a pattern generator according to the invention.

FIG. 8 illustrates yet another embodiment of a pattern generator according to the present invention, comprising a source for generating electromagnetic radiation 810, a first Bragg cell 820, a second Bragg cell 830, an illuminator aperture 840, a modulator 850, a collimator 860, a scanner 870, a system aperture 875, a lens 880 and a workpiece 890.

The source for generating electromagnetic radiation may be a doubled gas laser or a quadrupled YAG-Nd laser. A beam of said radiation source is sent through two acousto-optic Bragg cells 820, 830, which split the beam into an array of beamlets with frequency shift from the driving RF. The driving RF of the Bragg cells may be 500 MHz phase modulated with 160 MHz bandwidth noise. The result is a two-dimensional diffraction pattern with random momentary speckle pattern, but over time it takes for a scanned image to move one resolution spot on the workpiece 890 said speckle is averaged out. The beams can therefore be considered to be non-interfering. All beamlets are focussed onto the same area of the modulator 850. The device 800 creates a partially coherent image at each spot.

The illuminator aperture 840 determines a mutual coherence function in image and the shape of the beam. Said illuminator aperture may comprise a plurality of lenses at both sides of an aperture stop. The beam may first be split in 2, 3 or more beamlets in the first Bragg cell 820. Said beamlets are each further divided into 2, 3 or more beamlets, possibly in another direction compared to the beamlets coming out of the first Bragg cell, thereby creating a 2-dimensional pattern of beamlets. The modulator 850 for creating an image to be imaged onto the workpiece 890 may be a 2-dimensional modulator comprising an array of acousto-optic driven transducers, 2-dimensional array of actuators, such as micromirrors in an SLM or transmissive pixels of liquid crystal type or similar 2-dimensional modulating elements.

For each embodiment the pattern description to be loaded in the modulator is stored in an input pattern data file and preferably made prior to the patterning of the workpiece.

The scanner 870 may be a mechanical scanner or an acousto-optic scanner or any scanning device with similar properties. The image on the workpiece is created by superposition of individually incoherent beamlets although said beamlets are originating from a coherent radiation source 810.

If data is loaded onto the modulator in the direction of the arrow 855 indicated in FIG. 8*a* direction of scanning is in an opposite direction according to the arrow 882 at the workpiece. The workpiece may be moved according to the arrows 884 indicated in the same figure. Data is scrolled over the modulator and individual elements still present in said data is/are imaged onto a specific location of the workpiece. The movement of the workpiece, the speed of scanning and the speed of loading data on the modulator are all synchronized to obtain the desired pattern on the workpiece.

In the present invention an image, with properties essentially equivalent to those in a partially coherent projector such as a stepper or an SLM pattern generator, is formed by the superposition of sub-images that are mutually incoherent, typically formed by laser beams that are separated in time, space, angle and/or frequency. In contrast to a conventional laser scanner where the beams are mere on-off pencils, each beam according to the inventive concept forms a sub-image. Different embodiments of the invention, as described in connection with the figures, differ as to the method of impressing the sub-image on the beam and in the method of adding the sub-images to create a final image.

The methods described in this disclosure have as an object to create a mutual coherence function in the image that is similar to that of a partially coherent projection system. With partially coherent imaging it is possible to enhance certain aspects of the image, e.g., to improve depth of focus on small features, by modifying the mutual coherence function, or equivalently modifying the modulator pupil shape and size. The invention serves to synthesize a mutual coherence function and it can be similarly modified by control of stops in the beam path. In particular the shape of the scanning spot is determined by the pupil function of the beam forming optics. The mutual coherence function is closely related to the spot shape of the scanning spots. Therefore modifications to the spots by pupil functions may be used to create similar image enhancements as a lithographic stepper.

Thus, although there has been disclosed to this point particular embodiments of the apparatus for patterning a workpiece, it is not intended that such specific references be considered as limitations upon the scope of this invention except in-so-far as set forth in the following claims. Furthermore, having described the invention in connection with certain specific embodiments thereof, it is to be understood that further modifications may suggest themselves to those skilled in the art, it is intended to cover all such modifications as fall within the scope of the appended claims.

The invention claimed is:

1. An apparatus for patterning a workpiece arranged at an image plane and covered at least partly with a layer sensitive to electromagnetic radiation, comprising:
   a source emitting electromagnetic radiation onto an object plane,
   an SLM comprising a plurality of on-off object pixels, adapted to receiving and modulating said electromagnetic radiation at said object plane in accordance with a pattern and relaying said electromagnetic radiation toward said workpiece,
   a synchronizer to synchronize the motion of the workpiece relative to the pattern relayed from said SLM onto said workpiece, and
   an image-deflecting element arranged between said SLM and said workpiece adapted to deflect said relayed pattern description, wherein the modulation creates coherent sub-images on the workpiece and several sub-images are non-coherently superposed to create a final image.

2. The apparatus according to claim 1, wherein said SLM comprises transmissive pixels.

3. The apparatus according to claim 1, wherein said SLM comprises reflective pixels.

4. The apparatus according to claim 3, wherein said reflective pixels are micromirrors.

5. The apparatus according to claim 1, wherein said synchronization is performed to cause said relayed pattern description to impinge on a fixed area of said workpiece for an extended period of time.

6. The apparatus according to claim 1, wherein radiation from said electromagnetic radiation source is prevented from impinging onto said workpiece while reloading said SLM with a new pattern description.

7. The apparatus according to claim 6, wherein said radiation is deflected in order to be prevented from impinging onto said workpiece.

8. The apparatus according to claim 6, wherein said radiation is blocked in order to be prevented from impinging onto said workpiece.

9. The apparatus according to claim 6, wherein said radiation source is switched off in order to prevent said radiation from impinging onto said workpiece.

10. The apparatus according to claim 1, wherein successive pattern descriptions on said SLM are imaged onto said workpiece adjacent to each other.

11. The apparatus according to claim 10, wherein successive pattern descriptions on said SLM are non-overlapping on said workpiece.

12. The apparatus according to claim 1, wherein successive pattern descriptions on said SLM are imaged onto said workpiece non-adjacent to each other.

13. The apparatus according to claim 1, wherein said image deflecting element is a rotating prism.

14. The apparatus according to claim 1, wherein said image deflecting element is a rotating reflective polygon.

15. The apparatus according to claim 14, wherein said rotating reflective polygon comprises at least three reflecting surfaces.

16. The apparatus according to claim 1, wherein said pattern description on said SLM is changed while deflecting said relayed pattern description onto the workpiece.

17. A method for patterning a workpiece arranged at an image plane and covered at least partly with a layer sensitive to electromagnetic radiation, comprising the actions of:
emitting electromagnetic radiation onto an object plane,
receiving and modulating said electromagnetic radiation at said object plane in accordance with a pattern from an SLM comprising a plurality of on-off object pixels,
relaying said modulated electromagnetic radiation toward said workpiece,
deflecting a relayed pattern onto said workpiece,
synchronizing motion of the workpiece relative to said relayed pattern, and
imaging successive patterns onto said workpiece adjacent to each other, wherein said successive patterns are at least partially overlapping on said workpiece, and wherein said successive patterns create coherent sub-images on the workpiece and the successive sub-images are non-coherently superposed to create a final image.

18. The method according to claim 17, wherein said SLM comprises transmissive pixels.

19. The method according to claim 17, wherein said SLM comprises reflective pixels.

20. The method according to claim 19, wherein said reflective pixels are micromirrors.

21. The method according to claim 17, wherein said synchronizing is performed to cause said relayed pattern description from said SLM to impinge on a fixed area of said workpiece for an extended period of time.

22. The method according to claim 17, further comprising the action of preventing said radiation from said electromagnetic radiation source from impinging onto said workpiece while reloading said SLM with a new pattern description.

23. The method according to claim 22, wherein said radiation is deflected in order to be prevented from impinging onto said workpiece.

24. The method according to claim 22, wherein said radiation is blocked in order to be prevented from impinging onto said workpiece.

25. The method according to claim 22, wherein said radiation source is switched off in order to prevent said radiation from impinging onto said workpiece.

26. The method according to claim 17, further comprising the action of:
imaging successive pattern descriptions onto said workpiece non-adjacent to each other.

27. The method according to claim 17, wherein said image deflecting element is a rotating prism.

28. The method according to claim 17 wherein said image deflecting element is a rotating reflective polygon.

29. The method according to claim 28, wherein said rotating reflective polygon comprises at least three reflecting surfaces.

30. The method according to claim 17, further comprising the action of:
performing greyscale printing by time multiplexing the object pixels.

31. The method according to claim 17, wherein said synchronization is performed to write stamps onto said workpiece corresponding to pattern descriptions on said SLM, where said stamps defining sub-images together form a complete pattern.

32. The method according to claim 17, further comprising the action of:
changing said pattern description on said SLM while deflecting said relayed pattern description onto the workpiece.

33. A method to form an image comprising the actions of:
providing a laser source,
scanning at least one beam from said laser source over a workpiece,
modulating said at least one beam during scanning according to an input pattern data file, where said modulation of the beam creates a coherent sub-image on the workpiece and several sub-images are non-coherently superposed to create a final image.

34. The method according to claim 33, further comprising the action of:
destroying the interference between individual beams before impinging onto the SLM.

35. The method according to claim 34, wherein said interference between individual beams are destroyed by means of adding or subtracting a shift in frequency.

36. The method according to claim 34, wherein said interference between individual beams are destroyed by means of adding or subtracting a portion of path length.

37. The method according to claim 33, wherein said at least one beam is modulated by means of an acousto-optic cell comprising an array of transducers.

38. The method according to claim 33, wherein said transducers are driven by a RF wave multiplied by an analogue signal.

39. The method according to claim 33, wherein said at least one beam is modulated by means of an SLM comprising a plurality of on-off pixels.

40. A method for forming an image onto a workpiece, comprising the actions of:

providing an electromagnetic radiation source, scanning at least one beam from said source over at least a portion of a spatial light modulator, modulating said at least one beam according to an input pattern data file, where said modulation of the at least one beam creates a coherent sub-image on the workpiece and several sub-images are non-coherently superposed to create a final image.

41. The method according to claim 40, further comprising the action of:

reloading a new pattern description on at least one portion of said modulator while scanning a different portion of said modulator by said at least one beam.

42. The method according to claim 40, wherein said SLM comprising a plurality of on-off pixels.

43. An apparatus for forming a pattern on a radiation sensitive material comprising:

a source to form a radiation beam, a scanning element to scan at least one beam from said radiation source over said radiation sensitive material, a modulator to modulate said at least one beam during scanning according to an input pattern data file, where said modulation of the beam creates a coherent sub-image on the workpiece and several sub-images are non-coherently superposed to create a final image.

44. The apparatus according to claim 43, further comprising an element to destroy the interference between individual beams before impinging onto the SLM.

45. The apparatus according to claim 44, wherein the interference is destroyed by an element, which adds or subtracts a shift in frequency unequal for interferable beams.

46. The apparatus according to claim 44, wherein the interference is destroyed by an element, which adds or subtracts an unequal portion of optical path-length for interferable beams.

47. The apparatus according to claim 44, wherein said modulator is an acousto-optic cell comprising an array of transducers.

48. The apparatus according to claim 47, wherein said transducers are driven by a RF wave multiplied by an analogue signal.

49. An apparatus for forming a pattern on a radiation sensitive material comprising:

a source to form a radiation beam, a scanning element to scan at least one beam from said radiation source over a spatial light modulator, a modulator to modulate said at least one beam according to an input pattern data file, where said modulation of the beam creates a coherent sub-image on the workpiece and several sub-images are non-coherently superposed to create a final image.

50. The apparatus according to claim 49, where a new pattern description is reloaded on at least one portion of said modulator while scanning a different portion of said modulator by said at least one beam.

51. An apparatus for patterning a workpiece arranged at an image plane and covered at least partly with a layer sensitive to electromagnetic radiation, comprising a source emitting electromagnetic radiation onto an object plane, a modulator comprising a plurality of modulating elements, adapted to receive and modulating said electromagnetic radiation at said object plane in accordance with a pattern and to relay said electromagnetic radiation toward said workpiece, a synchronizer to synchronize the motion of the workpiece relative to a relayed pattern from the modulator onto said workpiece, and an image-deflecting element adapted to deflect said relayed pattern on the workpiece, wherein the modulation creates coherent sub-images on the workpiece and several sub-images are non-coherently superposed to create a final image.

52. A method for patterning a workpiece arranged at an image plane and covered at least partly with a layer sensitive to electromagnetic radiation, comprising the actions of:

emitting electromagnetic radiation onto an object plane, receiving and modulating said electromagnetic radiation at said object plane in accordance with a pattern by a modulator comprising a plurality of modulating elements, relaying said electromagnetic radiation toward said workpiece, deflecting a relayed pattern from said modulator onto said workpiece, synchronizing the motion of the workpiece relative to a relayed pattern from said modulator onto said workpiece and a loading of said input pattern description, wherein the modulation creates coherent sub-images on the workpiece and several sub-images are non-coherently superposed to create a final image.

* * * * *